United States Patent
Murray

(10) Patent No.: US 6,469,930 B1
(45) Date of Patent: Oct. 22, 2002

(54) COMPACT NONVOLATILE CIRCUIT HAVING MARGIN TESTING CAPABILITY

(75) Inventor: Kenelm Murray, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 17 days.

(21) Appl. No.: 09/703,151

(22) Filed: Oct. 30, 2000

(51) Int. Cl.[7] .............................................. G11C 14/00
(52) U.S. Cl. ........................ 365/185.08; 365/185.05; 365/185.07; 365/154
(58) Field of Search ..................... 365/185.08, 185.07, 365/154, 185.05

(56) References Cited

U.S. PATENT DOCUMENTS

| | | | |
|---|---|---|---|
| 4,132,904 A | | 1/1979 | Harai |
| 4,800,533 A | | 1/1989 | Arakawa |
| 5,065,362 A | * | 11/1991 | Herdt et al. ................. 365/154 |
| 5,189,641 A | * | 2/1993 | Arakawa ..................... 365/228 |
| 5,353,248 A | | 10/1994 | Gupta |
| 5,440,508 A | | 8/1995 | Pathak et al. |
| 5,488,579 A | | 1/1996 | Sharma et al. |
| 5,496,756 A | | 3/1996 | Sharma et al. |
| 5,602,776 A | * | 2/1997 | Herdt et al. ............ 365/185.08 |
| 5,864,499 A | * | 1/1999 | Rohparvar et al. .... 365/185.08 |
| 5,892,712 A | * | 4/1999 | Hirose et al. .......... 365/185.07 |
| 5,956,269 A | * | 9/1999 | Ouyang et al. ........ 365/185.08 |
| 5,986,932 A | * | 11/1999 | Ratnakumar et al. .. 365/189.07 |
| 6,285,586 B1 | * | 9/2001 | Lung et al. ............ 365/185.08 |

* cited by examiner

*Primary Examiner*—Michael S. Lebentritt
*Assistant Examiner*—Tuan T. Nguyen
(74) *Attorney, Agent, or Firm*—Bradley T. Sako

(57) ABSTRACT

According to one embodiment, a nonvolatile circuit (100) can include a volatile circuit portion (102) and a nonvolatile circuit portion (104). A vole portion (102) may have a first data node (114) and a second data node (116). A nonvolatile circuit portion (104) may include a nonvolatile device (128) that is connected to a first data node (114) by a recall device (124) and connected to a second data node (116) by store device (126). A recall device (124) may be enabled to recall the volatile circuit portion (102) to a particular state. A store device (126) may be enabled to program a nonvolatile device (128). Store and recall devices (126 and 124) can enable a recall operation to follow a store operation that does not invert data at first and second data nodes (114 and 116). A control device (122) can be included that enables margin testing of a nonvolatile device (128).

21 Claims, 5 Drawing Sheets

| SIGNAL | CG | PW | RD | STO | RCL | MAR | WL | D1 | D2 |
|---|---|---|---|---|---|---|---|---|---|
| ERASE | Vcc-Ve | Vcc | Vss | Vss | Vss | Vss | X | DATA | DATAB |
| STORE | +Vp | Vss | Vss | +Vp | Vss | Vss | Vss | DATA | DATAB |
| RECALL PRESET | Vss (Vb1) | Vss | Vss | Vss | Vss | Vss | Vcc | Vcc | Vss |
| STATIC RECALL | Vb1 | Vss | Vcc | Vss | Vcc | Vb3 | Vss | DATA | DATAB |
| DYNAMIC RECALL | Vb1 | Vss | Vcc | Vss | Vcc | Vcc (Dyn) | Vss | DATA | DATAB |
| SRAM READ/WRITE | Vb2 (Vss) | Vss | Vcc/Vss | Vss | Vss | Vss | X | DATA/DATAB | DATAB/DATA |

COMPACT NONVOLATILE CIRCUIT HAVING MARGIN TESTING CAPABILITY

TECHNICAL FIELD

The present invention relates generally to nonvolatile circuits, and more particularly to nonvolatile circuits that may be programmed to recall one or more particular states.

BACKGROUND OF THE INVENTION

Integrated circuit devices may include volatile and nonvolatile circuit elements. As is well known, volatile circuit elements are typically not capable of retaining a particular state in the absence of power. In contrast, nonvolatile circuits can retain one of at least two states in the absence of power. Nonvolatile circuit elements may include, without limitation, various erasable programmable read-only-memory cells (such as EPROMs, conventional EEPROMs, and "flash" EEPROMs). A typical EPROM cell can take advantage of a charge storing structure, such as a floating gate, a charge storing dielectric and/or a charge-trapping interface of materials. Alternate nonvolatile structures may take advantage of other materials, such as ferroelectric materials, or the like.

One concern with many nonvolatile circuit elements can be variations in response over time. In particular, a nonvolatile circuit element may include a field effect transistor having a threshold voltage that may be set to at least two states. Such a field effect transistor may have a charge storing structure (e.g., a floating gate or charge storing dielectric), and can be programmed to one threshold voltage and erased to another threshold voltage. Typically, an erased threshold voltage is less than a programmed threshold voltage.

Unfortunately, a nonvolatile transistor threshold voltage can change over time. Such changes can arise due to "disturbs" caused by local fields generated on a device. In addition, charge may leak from a charge storing structure. If a threshold voltage changes a sufficient amount, an erased threshold may be misread as a programmed voltage, or vice versa.

Typically, conventional volatile circuits may provide a more rapid response than nonvolatile circuits. Thus, data may be written to conventional volatile circuit elements faster than it can be stored (programmed) into conventional nonvolatile circuit elements.

While conventional volatile circuits can typically operate with acceptable reliability, in most environments, it can be advantageous to add nonvolatile functionality to a circuit. For example, in some applications, a device may be subject to unwanted interruptions in power. In such a case, it may be advantageous to preserve a circuit state or pre-programmed data so that circuit operation may resume once power is returned.

One example of a circuit that may provide both rapid operation and a form of nonvolatility is a nonvolatile (NV) static random access memory (SRAM) cell. A NVSRAM cell may have data stored (or programmed). The NVSRAM cell may then operate in a conventional SRAM manner by receiving data values according to write operations and providing data values according to read operations.

Unlike volatile SRAM cells, a NVSRAM cell may further include a recall operation. In a recall operation, a NVSRAM cell can be forced to the state established in a previous store operation. Such an arrangement can allow stored data to be preserved in the event that power is interrupted. More particularly, if a power interruption is detected, a limited amount of back up power can be made available to store the current state of a volatile SRAM circuit in nonvolatile circuit elements.

One example of a conventional NVSRAM cell is shown in FIG. 6 and designated by the general reference character 600. A conventional NVSRAM cell 600 may include a volatile section 602 and a nonvolatile section 604. A volatile section 602 may include a conventional six-transistor (6-T) memory cell with cross-coupled complementary driver transistors 606/608 and 610/612. A first data node 614 may be formed between drains of transistors 606 and 608, while a second data node 616 may be formed between drains of transistors 610 and 612. First and second data nodes (614 and 616) can store complementary data values that may be accessed by access transistors 618 and 620.

A conventional NVSRAM cell 600 can differ from a typical SRAM cell in that complementary data nodes (614 and 616) may be connected to a nonvolatile portion 604. Such an arrangement can enable a data value stored in a volatile section 602 to be programmed into a nonvolatile section 604. Such programmed data in a nonvolatile section 604 may then be recalled into a volatile section 602.

In an arrangement such as that shown in FIG. 6, a nonvolatile section 604 may include a pair of nonvolatile devices 622 and 624 that may be programmed to complementary states. More particularly, nonvolatile devices 622 and 624 can be silicon-oxide-nitride-oxide-silicon (SONOS) transistors that may be programmed to different threshold voltages. Nonvolatile devices (622 and 624) may be connected to a volatile section 602 by a load path that includes load devices 626 and 628 and a program path that includes program devices 630 and 632.

A load path (626 and 628) may be used to connect nonvolatile devices (622 and 624) to a volatile section 602 in a recall operation. More particularly, nonvolatile devices 622 and 624 that are programmed to different threshold voltages can be connected to data nodes (614 and 616) so that one data node can be lower than the other as a power supply to the volatile section 602 is ramped up. A conventional NVSRAM 600 may thus rely on two nonvolatile devices (622 and 624) set to different states.

A program path (630 and 632) may be used to connect nonvolatile devices (622 and 624) to a volatile section 602 in a store operation. More particularly, nonvolatile devices 622 and 624 may be initially erased. Complementary values at data nodes (614 and 616) may then be used to program nonvolatile devices 624 or 622, respectively, to different threshold voltages.

As shown in FIG. 6, a program path (630 and 632) connection to data nodes 616 and 614, respectively, can have a crossover with respect to a load path (626 and 628) to data nodes (614 and 616). Such an arrangement may be included because a set of data node values used to program nonvolatile devices (622 or 624) can result in an opposite set of data values being recalled from the nonvolatile devices (622 or 624).

A nonvolatile section 604 may also include programming devices 634 and 636, which can connect a programming voltage to nonvolatile devices (622 and 624) in a program operation and a ground connection during a non-volatile recall.

A drawback to conventional arrangements, like that shown in FIG. 6, can be the number of devices included in the circuit. As noted above, a conventional NVSRAM 600 may include two nonvolatile devices as it can rely on programming such devices to different states. Further, because two nonvolatile devices can be used, a program path (630 and 632) and load path (626 and 628) may include two devices. Such devices can increase the overall area required for a NVSRAM cell. A larger cell area can work against the goal of reducing overall die size. Smaller die sizes are desirable, as they can allow for more economical manufacturing of integrated circuits.

It is understood that a NVSRAM 600 could also include additional circuit elements, including but not limited to "hold" devices (634 and 636) that may isolate p-channel driver devices (606 and 610) from their corresponding n-channel driver devices (608 and 612), an equalization device for equalizing data nodes (614 and 616), and/or dual port circuitry that allows additional access to one or both data nodes (614 and 616).

Having described a "differential" approach to a NVSRAM (i..e., two nonvolatile devices programmed to different states), a "single-side" approach to a NVSRAM will now be described.

Referring now to FIG. 7, another conventional NVSRAM cell is designated by the general reference character 700, and is shown to include a volatile portion 702 and a nonvolatile portion 704. Such a conventional NVSRAM cell is disclosed in U.S. Pat. No. 5,488,579 issued to Sharma et al. on Jan. 30, 1996.

Referring back to FIG. 7, a volatile portion 702 may include a conventional 6-T volatile SRAM as previously described. To that extent, like elements are referred to by the same reference character but with the first digit being a "7" instead of an "6." A nonvolatile section 704 may include a nonvolatile device 722, a node isolation device 724 and a supply isolation device 726.

Because a conventional NVSRAM cell 700 represents a one-sided approach, such an NVSRAM may only include one nonvolatile device 722. This can result in a more compact structure than that shown in FIG. 6.

A drawback to a NVSRAM cell 700 can be additional circuitry and/or complexity that may be required to execute various functions. More particularly, it is not clear how back-to-back store/recall operations can occur without inverting data values. It appears that a store operation may include writing the opposite value of what is to be recalled, or various unconventional voltage arrangements, such as a negative voltage during recall or a very high positive voltage during programming.

For example, it will be assumed that in a store operation, node 716 is high, while node 714 is low. With node 716 high, a gate of a supply isolation device 726 can be high while a gate of node isolation device 724 can be low. A gate of nonvolatile device 722 may then initially transition low, and then transition high. An initial low voltage at a gate of nonvolatile device 722 in conjunction with a high voltage at node 716 can result in nonvolatile device 722 being programmed, as an electric field may enable electrons to tunnel from a charge storing layer to a substrate or transistor channel, source and/or drain region.

Because node 716 is already high, when a gate of nonvolatile device 722 transition high, an electric field across a tunneling dielectric can be sufficiently small to prevent significant tunneling from a substrate or transistor channel, source and/or drain region, to a charge storing layer. This can increase a threshold voltage of a nonvolatile device 722.

It is noted that if a recall operation immediately follows the previously described store operation, node 716 can have an opposite value to that used in programming. In a recall operation, the gates of a node isolation device 724 and supply isolation device 726 can be low. Consequently, a potential at data node 716 can depend upon a threshold voltage of a nonvolatile device 722. However, because a nonvolatile device 722 was previously programmed, the description of the device implies that data node 714 can be driven high, while data node 716 will be driven low. A low data node 716 value is the opposite of the value used to initially program the NVSRAM. Hence, a data value may invert when a store operation is followed by a recall operation.

Another drawback to a NVSRAM cell 700 can be the reliability of a recall cycle. In particular, a volatile portion 702 can remain enabled during a recall operation. Consequently, if a recalled value places a volatile operation in the opposite state to what is currently being stored, a nonvolatile portion 704 may have to "overpower" the current state of a volatile portion 702.

In light of the above drawbacks that may be inherent in conventional nonvolatile circuits, it would be desirable to arrive at a nonvolatile circuit that may have fewer circuit devices than that of FIG. 6, yet not suffer from the drawbacks that may be present in an approach like FIG. 7.

It is also noted that the above-described conventional approaches do not appear to provide a way of testing a nonvolatile device for possible changes in threshold voltage (i.e., perform a margin test). It would thus be desirable to arrive at some way of margin testing a nonvolatile circuit.

SUMMARY OF THE INVENTION

According to embodiments of the present invention, a nonvolatile circuit may include a volatile circuit portion and a nonvolatile circuit portion. A nonvolatile circuit portion may be programmed and/or erased to store, in a nonvolatile fashion, a particular state. Such a nonvolatile state may establish the state of a volatile circuit portion in a recall operation. Reduction in circuit components may be achieved by including only one nonvolatile device.

According to one aspect of the embodiments, separate store and recall paths may be provided between a volatile circuit portion and a nonvolatile device. Consequently, a recall operation can be performed after a store operation that does not result in an inversion of data values.

According to another aspect of the embodiments, a nonvolatile device may include a silicon-oxide-nitride-oxide-silicon (SONOS) transistor.

According to another aspect of the embodiments, data nodes in a volatile circuit portion may have complementary logic values. Such data nodes can be connected to a nonvolatile device through store and recall paths.

According to another aspect of the embodiments, in a recall operation a data node can be discharged (or charged) according to the state of a nonvolatile device. A control device may be included that controls the flow of current to a data node.

According to another aspect of the embodiments, a control device may allow margin testing of a nonvolatile device by indicating the amount of current that may be needed to discharge (or charge) a device in a recall operation.

According to another aspect of the embodiments, a control device may isolate a data node from a power supply in a recall operation, allowing for a rapid dynamic recall operation.

According to another aspect of the embodiments, a volatile circuit portion may include a static random access memory (SRAM) circuit.

According to another aspect of the embodiments, a volatile circuit portion may include a flip-flop circuit. Such a flip-flop circuit may include a set-reset flip-flop circuit and/or a D-type set-reset flip-flop circuit.

DETAILED DESCRIPTION OF THE EMBODIMENTS

Figures 1, 2:
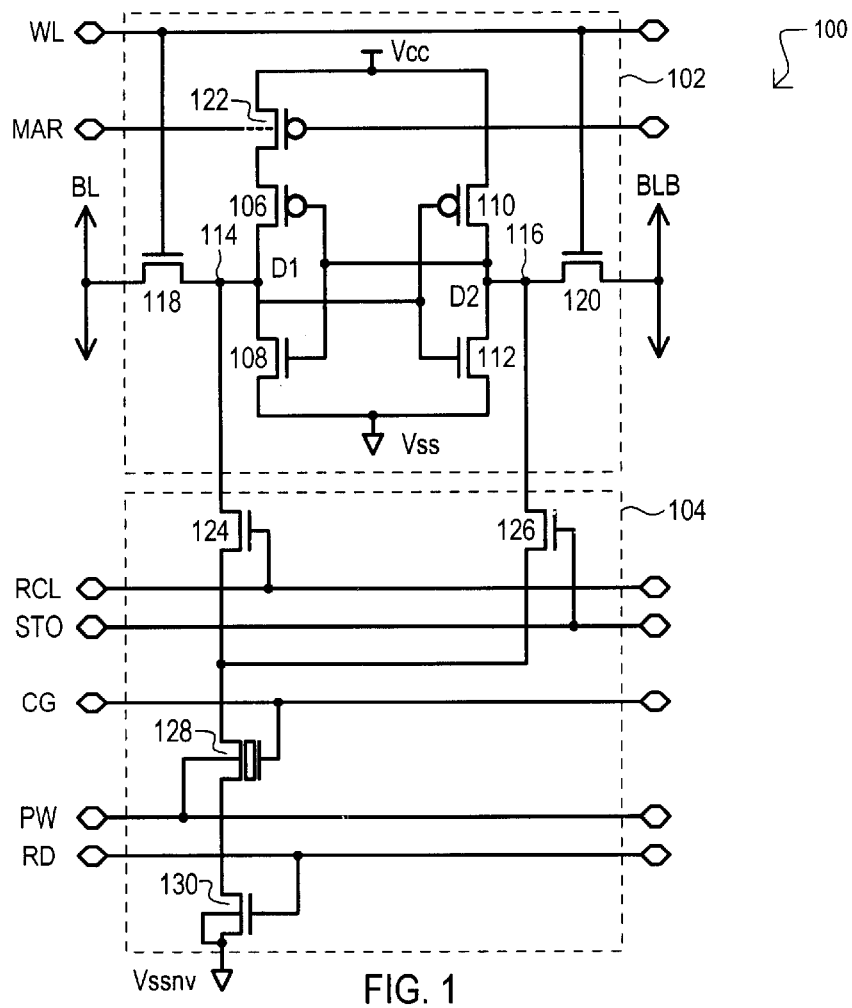
FIG. 1 is a schematic diagram of a first embodiment.
FIG. 2 is a table illustrating the operation of the first embodiment.

Various embodiment of the present invention will now be described in conjunction with a number of diagrams. Referring now to FIG. 1, a nonvolatile circuit is designated by the general reference character 100 and is shown to include a volatile circuit portion 102 and a nonvolatile circuit portion 104.

The particular nonvolatile logic circuit of FIG. 1 may be a nonvolatile static random access memory (NVSRAM), and include the basic elements of a six transistor (6-T) static random access memory (SRAM). A volatile circuit portion 102 may thus include cross-coupled complementary driver devices 106/108 and 110/112. A connection between driver devices 106 and 108 may form a first data node 114, while a connection between driver devices 110 and 112 may form a second data node 116. First and second data nodes (114 and 116) can store complementary data values that may be accessed by access devices 118 and 120.

In the particular example of FIG. 1, driver devices 106 and 110 may include p-channel insulated gate field effect transistors (IGFETs), while driver devices 108 and 112 and access devices 118 and 120 can include n-channel IGFETs.

Unlike various other conventional approaches a volatile circuit portion 102 may include a control device 122. As will be describe in more detail below, a control device 122 may control the amount of current that may be sourced by driver transistor 106. Such an arrangement can allow for margin testing and dynamic recall operations, as will be described in more detail below.

In the particular example of FIG. 1, a control device 122 may include a p-channel IGFET having a source-drain path between the source of driver transistor 106 and a volatile power supply Vcc.

A nonvolatile circuit portion 104 may include a recall device 124, a store device 126, a nonvolatile device 128 and a supply isolation device 130. A recall device 124 can provide a path between a nonvolatile device 128 and a volatile circuit portion 102 that can enable a data value to be set in the volatile circuit portion 102 according to the state of a nonvolatile device 128. In the particular case of FIG. 1, a recall device 124 may include an n-channel IGFET having a source-drain path between data node 114 and a nonvolatile device 128.

A store device 126 can provide a path between a nonvolatile device 128 and a volatile circuit portion 102 that can enable a data value to set in the nonvolatile circuit portion 104 according to the state of a volatile circuit portion 102. In the particular case of FIG. 1, a store device 126 may include an n-channel IGFET having a source-drain path between data node 116 and a nonvolatile device 128. It is noted that a node 116 connected to a store device 126 can store a complementary value to a node 114 connected to a recall device 124.

A nonvolatile device 128 may include a device that provides an impedance according to a particular state. More particularly, a nonvolatile device 128 may include a field effect transistor having a different threshold voltage in different states. Even more particularly, a nonvolatile device 128 may include an n-channel silicon-oxide-nitride-oxide-silicon (SONOS) transistor having a source-drain path between a supply isolation device 130 and a recall device 124 and store device 126. A threshold voltage of such a SONOS device may be altered by the tunneling of electrons to and from a charge storing silicon nitride layer.

One skilled in the art would recognize that a SONOS device may include a charge-storing insulator separated from a channel by a channel insulator and from a control gate by a gate insulator. A channel insulator may comprise silicon dioxide, a charge layer may comprise silicon nitride, and a gate insulator may comprise silicon dioxide.

A supply isolation device 130 may be situated between a nonvolatile device 128 and a nonvolatile supply voltage Vssnv. In the particular case of FIG. 1, a supply isolation device 130 may include an n-channel IGFET having a source-drain path between a nonvolatile device 128 and a nonvolatile supply voltage Vssnv. A supply isolation device 130 can isolate a nonvolatile device 128 from a supply voltage Vssnv. Such an arrangement can prevent the programming of one nonvolatile device 128 from adversely affecting another. In one arrangement, a nonvolatile supply voltage Vssnv can be the same as a supply voltage Vss. In another arrangement, a non-volatile supply voltage Vssnv can be the same as the well connection of nonvolatile device 128.

Having described the construction of a first embodiment 100, a method of operating a first embodiment will now be described with reference to FIG. 2. FIG. 2 is a table showing various voltages according to particular operations. A first embodiment 100 may include an erase operation, a store operation, a recall preset operation, static and dynamic recall operations, and a SRAM read and write operation. An erase operation can set a nonvolatile device 128 to a first state. A store operation can set a nonvolatile device 128 to a first state or second state depending upon a data value stored in a volatile circuit portion 102. A SRAM read and write mode can allow a data value to be read from or written to a volatile circuit portion 102.

A recall mode can set a data value in a volatile circuit portion 102 according to the state of a nonvolatile device 128. In a first embodiment 100, a recall mode may be a two-step operation. Further, recall can be static or dynamic. A first step may include a recall preset operation that can establish a predetermined value in a volatile circuit portion 102. A second step can include a static or dynamic recall that can establish a logic value in a volatile circuit portion 102 according to the state of a nonvolatile device 128.

Various signals shown in FIG. 2 will now be described. A control gate signal CG can be applied to a gate of a nonvolatile device 128. A well signal PW can be applied to a well of a nonvolatile device 128. A read signal RD can be applied to a gate of an isolation device 130. A store signal STO signal can be applied to a gate of a store device 126. A recall signal RCL can be applied to a gate of a recall device 124. A margin signal MAR can be applied to a gate of a control device 122. A word line signal WL can be applied to gates of access devices (118 and 120). A first data value D1 can represent a voltage at a first data node 114. A second data value D2 can represent a voltage at a second data node 116.

In an erase operation, a nonvolatile device 128 can be separated from other portions of a NVSRAM circuit 100 and placed into a first state. More particularly, the RCL, STO and RD signals may all be low, turning off recall device 124, store device 126 and isolation device 130. A field may then be created across a nonvolatile device 128 that can enable tunneling from a charge storing structure to a substrate. More particularly, a CG signal can be driven to a negative erase potential −Ve (with respect to Vcc) while a PW signal can be at a high supply voltage Vcc. Within nonvolatile device 128, electrons can tunnel from a silicon nitride layer to a substrate. Such tunneling can place a nonvolatile device 128 in a low threshold voltage state. In one particular embodiment, an erase potential −Ve can be a negative voltage, relative to Vcc, having a magnitude less than 15 volts, more particularly less than 12 volts, even more particularly about 10 volts. It is noted that de-selected nonvolatile devices 128 (i.e., a nonvolatile device of a different row and/or different sector) can receive a CG signal at a Vcc level.

Alternatively, an erase field may be formed by driving a CG signal to a low supply voltage Vss while a PW signal is at a high substrate erase voltage. A high substrate erase voltage can be a positive voltage having a magnitude less than 15, more particularly less than 12 volts, even more particularly about 10 volts. In this case, a de-selected non-volatile device (i.e., a non-volatile device of a different row and/or different section) can receive a PW signal at a Vss level.

It is noted that while an erase operation is taking place, data stored in a volatile circuit portion 102 can remain undisturbed. Thus, a MAR signal can be low, and a volatile circuit portion 102 may operate as a conventional 6-T SRAM cell. Data values D1/D2 can be a currently stored data value while a WL signal may be high or low depending upon whether the cell is being accessed or not.

In a store operation, a nonvolatile device 128 can be separated from a nonvolatile supply voltage Vssnv and programmed according to a logic state stored in volatile circuit portion 102. More particularly, a RCL and RD signals may be low, turning off recall device 124 and isolation device 130. However, a STO signal can be high, turning on store device 126, and enabling a path between nonvolatile device 128 and data node 116.

A field may then be created across nonvolatile device 128. In the event a volatile circuit portion 102 stores one logic value, tunneling can be enabled from a substrate to a charge storing structure in a nonvolatile device 128. In the event a volatile circuit portion 102 stores another logic value, tunneling can be essentially disabled in a nonvolatile device 128. More particularly, a CG signal can be driven to a high programming voltage +Vp while PW signal can be at a low supply Vss. If data node 116 is at a low supply Vss, within nonvolatile device 128 electrons can tunnel from a substrate to a silicon nitride layer to place a nonvolatile device 128 in a high threshold voltage state. On the other hand, if data node 116 is at a high supply Vcc, within nonvolatile device 128 an electric field may be low enough that any substantial tunneling between a substrate and a silicon nitride layer can be inhibited. This can maintain a nonvolatile device 128 at a low threshold (erase) state.

In this way, a first embodiment 100 may enable a store path between a logic node in a volatile circuit portion 102 and a nonvolatile circuit portion 104. Such a store path can enable a state within a nonvolatile circuit portion 104 to be set according to a value stored in a volatile circuit portion 102.

A recall operation may include an initial recall preset. A recall preset can place a volatile circuit portion 102 into a predetermined state that can enable a data value to be subsequently set according to a nonvolatile device 128. More particularly, STO and RD signals may be low, turning off store device 126 and isolation device 130. However, a RCL signal may be high, turning on recall device 124 and enabling a recall path between nonvolatile device 128 and data node 114.

In the example of FIGS. 1 and 2, in a recall preset a volatile circuit portion 102 may be set to a particular state by driving a first node 114 to a high level Vcc, while driving a second node 116 to a low level Vss. In one particular arrangement, such an operation can include turning on access devices (118 and 120) by driving a WL signal high, and driving a bit line BL to a high level and a complementary bit line BLB to a low level.

By turning on recall device 124 and turning off isolation device 130, the preset first node 114 can also cause source and drain nodes of recall device 124 to preset to positive voltage levels and may cause the source node of nonvolatile device 128 to preset to a positive level depending upon whether nonvolatile device 128 is on or off.

FIG. 2 shows a CG that may be at a low supply voltage Vss or, more generally, at a first bias voltage Vbias1, either being chosen to discriminate between a programmed and erased state of the SONOS device and dependent on the threshold of the SONOS device in its natural un-programmed and un-erased state. Such a state may also be equal to the long term decayed threshold level of such a device. The bias can be used on CG during the preset phase to allow the source of the nonvolatile device 128 to reach a positive voltage ideal for a following RECALL phase. Pre-charged levels on the source and drain nodes of nonvolatile device 128 can prevent charge sharing between parasitic capacitors at these nodes and a parasitic capacitor at node 114, which could cause incorrect data recall during a following RECALL phase.

Following a recall preset, a recall operation may take place. A recall operation can be static or dynamic. In a static recall, the state of a nonvolatile device 128 can be used to establish a logic state in a volatile circuit portion 102. Further, in the arrangement of FIGS. 1 and 2, a static recall can margin test a nonvolatile device 128.

In a static recall, within a nonvolatile circuit portion 104 an STO signal can be low, turning off a store device 126 and isolating a second data node 116 from a nonvolatile device 128. In addition, RCL and RD signals can be high, turning on both recall device 124 and isolation device 130. This can enable a recall path from a first data node 114 to a nonvolatile supply Vssnv. Nonvolatile device 128 may also be included in such a recall path. A nonvolatile device 128 can receive a Vbias1 voltage on its gate, CG. Thus, the impedance of a recall path can depend upon the state of a nonvolatile device 128. More particularly, if a nonvolatile device 128 is in a programmed state, a recall path can have a high impedance with respect to an erased state. Conversely, if a nonvolatile device 128 is in an erased state, a recall path can have a low impedance with respect to a programed state.

In a static recall, within volatile circuit portion 102, a WL signal can be low, turning off access devices (118 and 120) thus isolating first and second data nodes (114 and 116) from bit lines (BL and BLB). In addition, a MAR signal can be at a Vbias3 voltage. A Vbias3 voltage can be used to limit the current that may flow through a volatile circuit portion 102. Such a limitation in current may be set to a precise level to distinguish between a programmed nonvolatile device 128 and an erased nonvolatile device 128. In particular, the current level set by the biased transistor 122 pulling node 114 positively through transistor 106 will compete with the current level set by the biased nonvolatile transistor 128 pulling node 114 negatively through recall transistor 124 and isolation transistor 130. If nonvolatile transistor 128 was previously programmed to a high threshold, or high impedance state, then node 114 can remain and recall to a more positive state. However, if nonvolatile transistor 128 was previously erased to a low threshold, or low impedance state, then node 114 can be pulled negatively until inverter transistors 110 and 112 can force node 116 high. A high node 116 can cause feedback inverter transistors 106 and 108 to reinforce a negative voltage on node 114. As will be described, such a limitation in current can also be used to margin test a NVSRAM circuit 100.

Referring back to FIG. 1, in a static recall operation, a first node 114 is initially preset to a high Vcc voltage. A recall path (which can include recall device 124, a nonvolatile device 128, and an isolation device 130) can be connected to a first node 114. If a nonvolatile device 128 is in a programmed state, a Vbias1 voltage can be less than a programmed threshold voltage. Consequently, a current drawn by a recall path may be small as compared to the case of an erased nonvolatile device 128, and a first node 114 can remain at a preset voltage Vcc.

In contrast, if a nonvolatile device 128 is in an erased state, a Vbias1 voltage can be greater than an erased threshold voltage. Consequently, a current drawn by a recall path may be large as compared to the case of a programmed nonvolatile device 128, and a first node 114 can be discharged to the point where cross-coupled driver transistors 106/108 and 110/112 can "flip," driving a first node to a low voltage Vss and a second node to a high voltage Vcc.

In this way, in a static recall, the state of a nonvolatile device 128 (e.g., erased/programmed) can result in a volatile circuit portion 102 being placed in a particular state (node 114 low/high and node 116 high/low).

It is noted that a static recall may also serve as a margin test for the NVSRAM. A Vbias3 voltage can control the amount of current that a control device 122 can source. Similarly, a Vbias1 voltage can control the amount of current a nonvolatile device 128 can sink. If a NVSRAM 100 is operating within margins, a nonvolatile device 128 can sink more current than control device 122 can source, thereby discharging first node 114 to the point where cross-coupled driver transistors 106/108 and 110/112 can "flip." However, if a NVSRAM 100 is not operating within margins (e.g., an erase threshold voltage is too high) a nonvolatile device 128 may not sink more current than control device 122 can source, and a first node 114 may not be discharged to the point where cross-coupled driver transistors 106/108 and 110/112 can "flip," or may be discharged at too slow a rate. Consequently, a first node 114 can remain at a high Vcc level.

Still further, the level of a MAR signal can be varied to find a range of values at which a volatile circuit portion 102 can flip, thereby determining a range of operation for a NVSRAM 100 with an erased nonvolatile device 128, thereby determining the extent of erasure in nonvolatile device 128.

A MAR signal may also be used to determine a age of operation for a NVSRAM 100 with a programmed nonvolatile device 128. More particularly, a CG signal can be driven to a potential greater than a Vbias1 voltage to allow a programmed nonvolatile device 128 to sink some amount of current. Margin testing can then proceed in the same general fashion as in the case of an erased nonvolatile device 128, and thereby determine the extent of programming in nonvolatile device 128.

In a dynamic recall operation, a first node 114 can be initially preset to a high Vcc voltage. A recall path can be connected to a first node 114 in the same fashion as a static recall operation. Further, a nonvolatile device 128 can receive a Vbias1 voltage. Thus, an erased nonvolatile device 128 can draw substantially more current than a programmed nonvolatile device 128.

Unlike a static recall, in a dynamic recall a control device 122 can receive a high MAR signal, thereby turning off control device 122. Thus, essentially no current can be supplied to a first data node 114 from a high power supply Vcc, allowing an erased nonvolatile device 128 to discharge a first data node 114. A programmed nonvolatile device 128 may not discharge a first data node 114. In particular operations, a MAR signal can be a high-going pulse.

In this way, in a dynamic recall, the state of a nonvolatile device 128 (e.g., erased/programmed) can result in a volatile circuit portion 102 being placed in a particular state (node 114 low/high and node 116 high/low). A dynamic recall may advantageously draw less current than a static recall, and so may be more suitable for low power applications.

In a SRAM read/write operation, data may be read from or written to a volatile circuit portion 102. In particular, a volatile circuit portion 102 may function as a conventional 6-T SRAM memory cell. More particularly, RCL and STO signals may be low, turning off recall device 124 and store device 126, thereby isolating a volatile circuit portion 102 from a nonvolatile circuit portion 104. Further, a MAR signal can be low, turning on control device 122, which can allow a volatile circuit portion 102 to function as a 6-T SRAM cell.

In a SRAM read operation, a WL signal can be high, turning on access devices 118 and 120, which can connect data nodes 114 and 116 to bit lines BL and BLB. A resulting differential voltage between bit lines BL and BLB may then be amplified by a sense amplifier or the like.

In a SRAM write operation a WL signal can be high, turning on access devices 118 and 120, which can connect data nodes 114 and 116 to bit lines BL and BLB. Complementary voltages on bit lines BL and BLB, established by a write amplifier or the like, may then establish complementary voltages on data nodes 114 and 116.

In a SRAM read/write operation, a nonvolatile device 128 may receive a Vbias2 voltage. A Vbias2 Voltage can be selected to minimize read disturbs of a nonvolatile device (i.e., the generation of electric fields across a device that may disturb its threshold voltage). In one particular embodiment, a Vbias2 Voltage may be equal to a Vbias1 voltage. A Vbias1 voltage can be the "natural threshold" voltage of a nonvolatile device.

It is noted that a NVSRAM 100 may have a two-cycle operating sequence. That is, an erase operation can precede each store operation. As noted above, one advantageous application for nonvolatile logic circuits, such as NVSRAM 100, can be to "store-on-power-fail." That is, if a power failure is detected, data currently stored in a volatile circuit portion 102 may be automatically stored in a nonvolatile circuit portion 104 by an erase operation followed by a store operation. Consequently, a NVSRAM 100 in such an application may include an external power supply sufficient to enable such an erase and store operation. Advantageously, during such an erase and store operation, a volatile circuit portion 102 can draw essentially no power.

Figure 7:
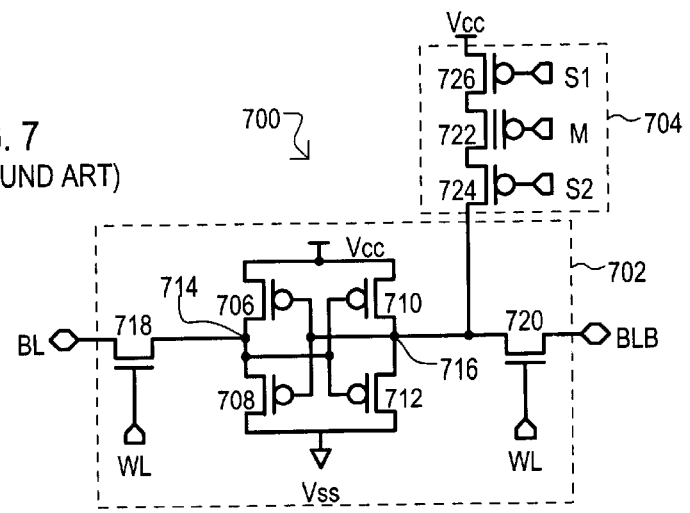
FIG. 7 is a schematic diagram of another conventional NVSRAM.

It is further noted that a when a store operation is followed by a recall operation, a data value stored in a volatile circuit portion 102 does not invert. In particular, a conventional NVSRAM circuit such as that shown in FIG. 7 can invert data when a recall operation follows a store operation. Such a feature can arise when a node potential used to program a particular value is the opposite of that recalled by the value. In contrast, according to the present invention, a recall device 124 and store device 126 can be connected to complementary data nodes 114 and 116. Such an arrangement can result in no change in data values in a volatile circuit portion 102 when a recall operation follows a store operation.

Figure 6:
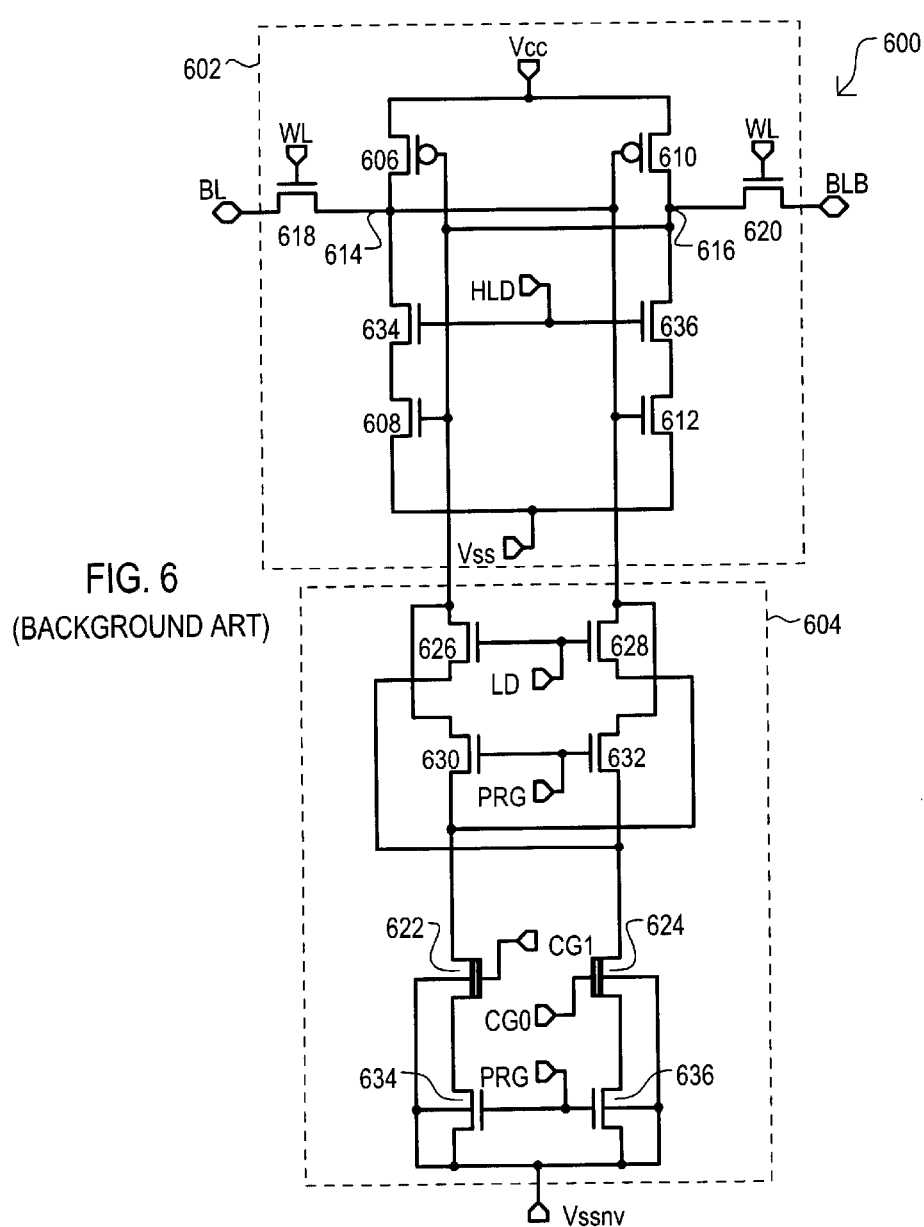
FIG. 6 is a schematic diagram of one conventional NVSRAM.

While the particular arrangement of FIG. 1 can provide for fewer transistors than a conventional differential approach, such as that shown in FIG. 6, it may be desirable to provide other ways of further reducing the area that may be required for a NSRAM cell.

A NVSRAM cell 100 of FIG. 1 can receive nine signals (WL, MAR, RCL, STO, CG, PW, BL, BLB and RD). Each signal can be carried on a conductive line (e.g., a metallization line, polysilicon line, or substrate diffusion region). In the event NVSRAM cells 100 are repeated in large number, such as in an array for example, the number of signal lines may lead to an undesirably large pitch.

Figure 3A:
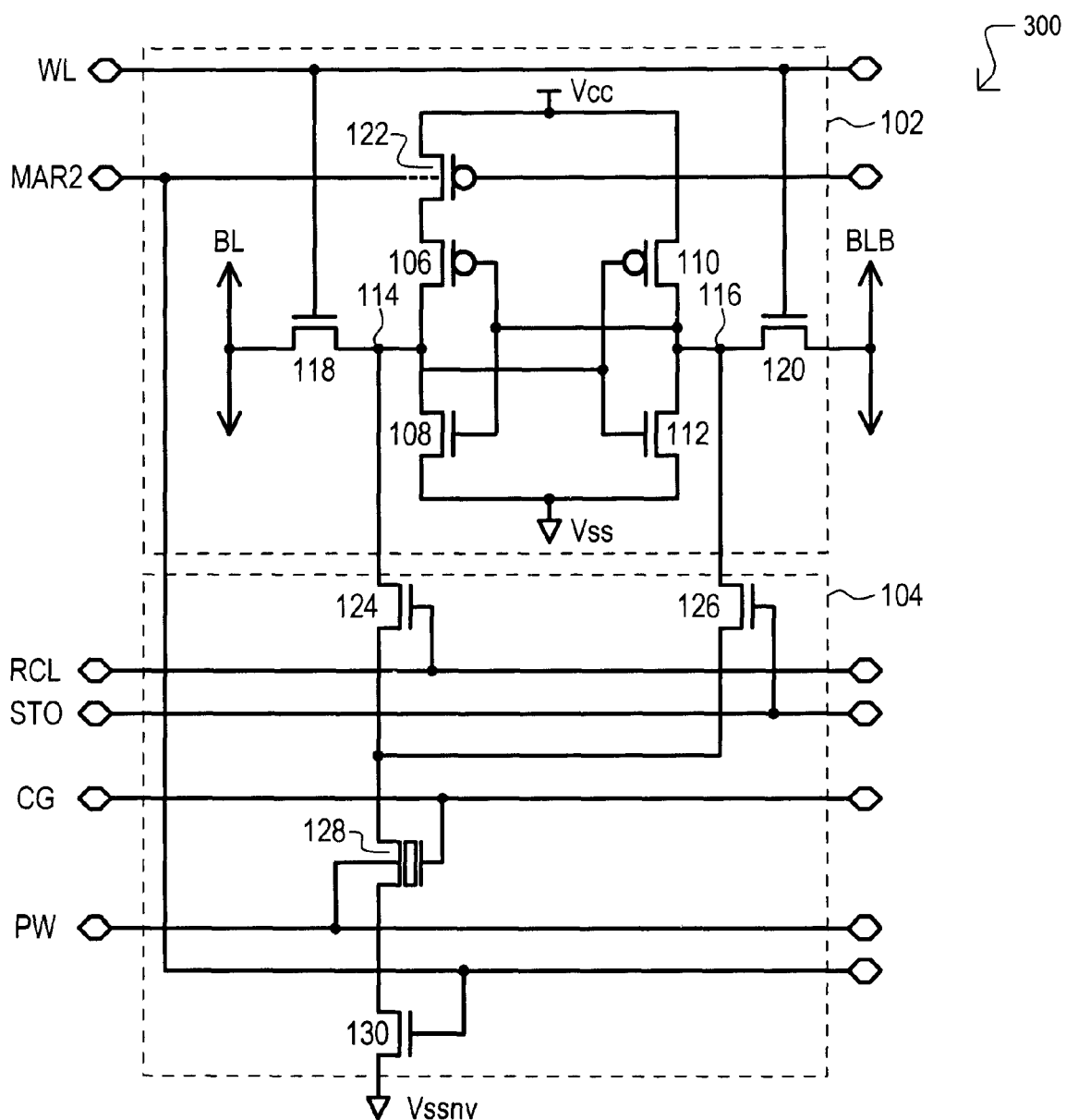
FIGS. 3A and 3B are schematic diagrams of second and third embodiments.
Figure 3B:
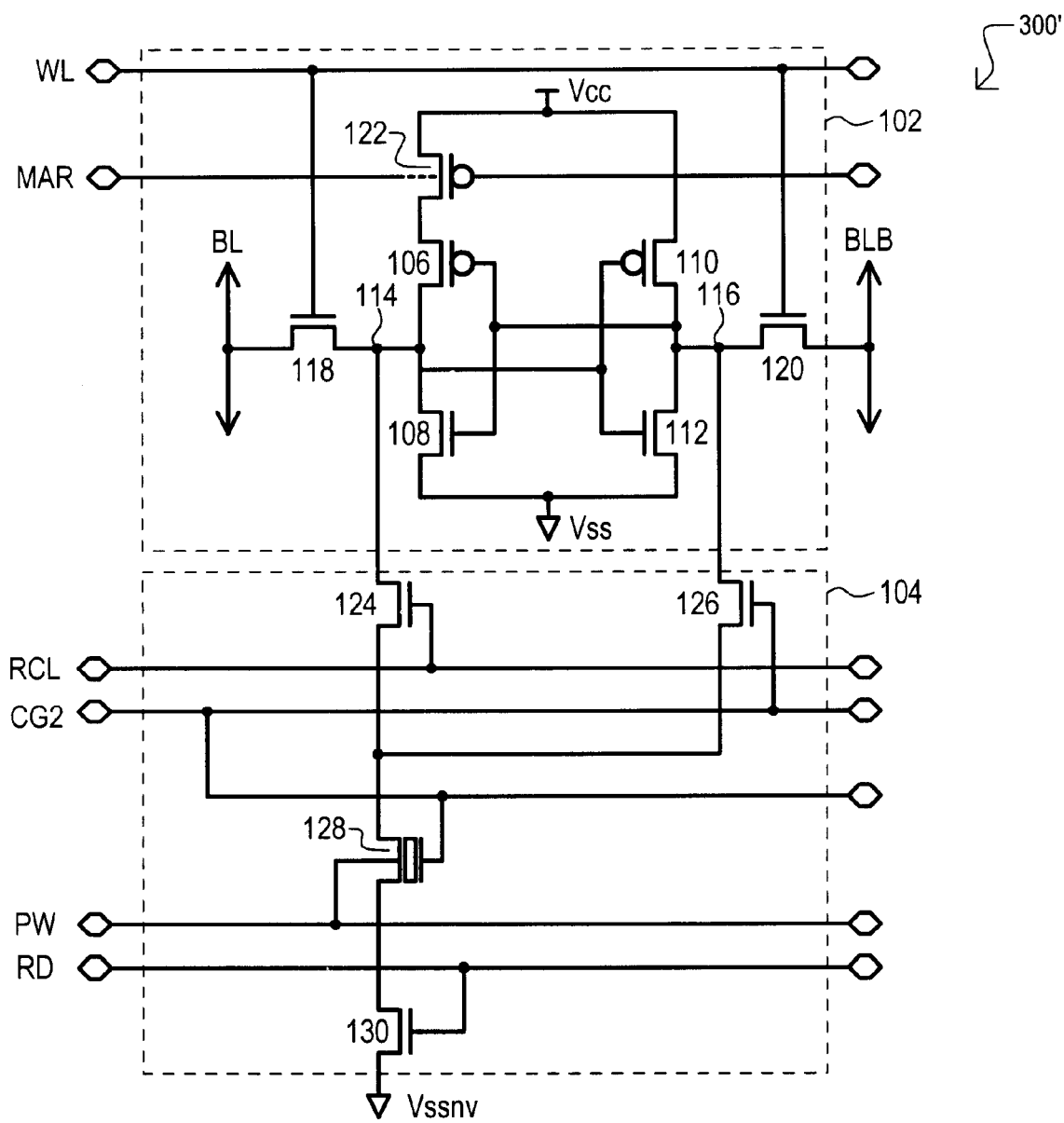

One way to reduce pitch can be to combine signal lines. FIGS. 3A and 3B shows a second embodiment 300 and third embodiment 300', in which signals are combined. FIGS. 3A and 3B includes NVSRAM cells (300 and 300') that may include the same circuit elements as FIG. 1. To that extent like elements are referred to by the same reference characters.

Referring now to FIG. 3A, in a second embodiment 300, a MAR and RD signals may be combined. Thus, a control device 122 and isolation device 130 can receive the same signal MAR2. A MAR2 signal may have the various values in particular modes as the MAR signal of FIG. 2. Driving an isolation device 130 with a Vbias3 voltage in a static recall can affect the measurement of margins. If Vbias3 is greater than the threshold voltage of an isolation device, relative margin measurements may be made in the same general fashion as a first embodiment 100.

Referring now to FIG. 3B, in a third embodiment 300', STO and CG signals may be combined. Thus, a store device 126 and a nonvolatile device 128 can receive the same signal CG2. A CG2 signal may have the various values in particular modes as the CG and STO signals combined of FIG. 2. Thus, in an erase operation, an erase voltage (Vcc−Ve) can keep store device 126 off. In a store operation, a program voltage +Vp can turn store device 126 on. Driving a nonvolatile device 128 with a bias voltage of Vss in the other modes may affect long term discrimination of an erased and progammed nonvolatile device 128 and may affect retention due to electric field disturb if the natural threshold voltage isn't at zero volts. These effects could be reduced, however, in this embodiment by the inclusion of a small bias on PW. Thus, by raising PW by a few hundred millivolts it can be possible to reduce the natural threshold of nonvolatile device 128.

Of course other embodiments could combine a MAR and RD and a STO and CG signal.

It is understood that the above-described embodiments have included one particular volatile circuit portion 102, namely a 6-T SRAM cell. However, the present invention may include numerous other volatile circuit portion types. Two particular examples of alternate volatile circuit portion types will now be described.

Figure 4:
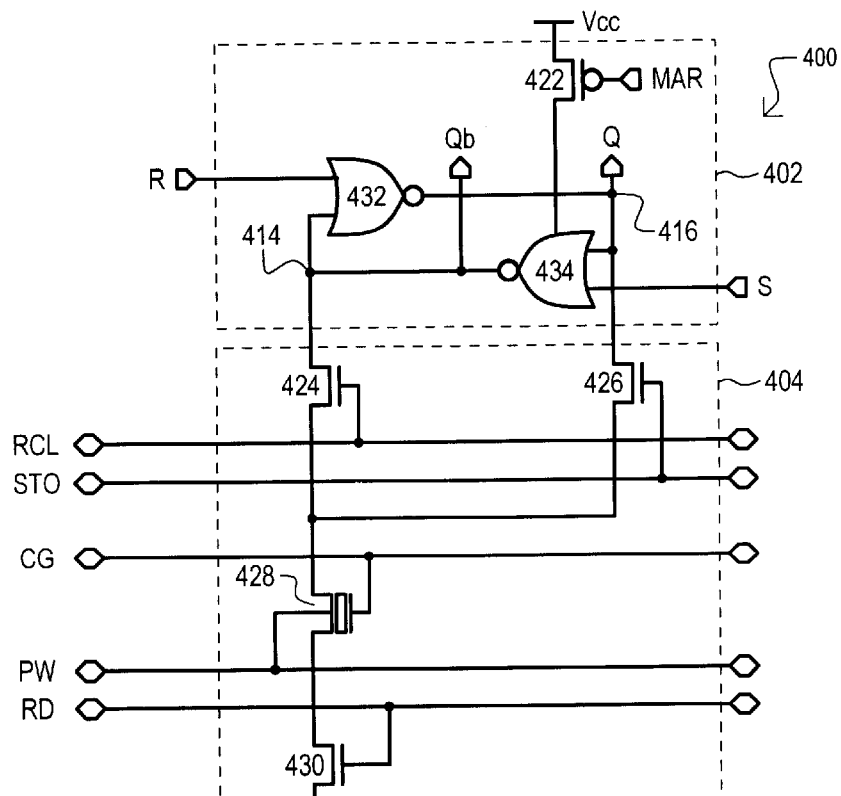
FIG. 4 is a schematic diagram of a fourth embodiment.

Referring now to FIG. 4 a fourth embodiment is designated by the general reference character 400 and may include a volatile circuit portion 402 and a nonvolatile circuit portion 404. A fourth embodiment 400 may include some of the same general constituents as a first embodiment 100. To that extent, like circuit elements will be referred to the by same reference character to but with the first digit being a "4" instead of a "1".

As shown in FIG. 4, a volatile portion 402 may include a set-reset flip-flop (SR FF) circuit. The particular SR FF shown may be a NOR gate based SR FF, and so can include cross-coupled NOR gates 432 and 434. As is well known, a SR FF can include a set input and reset input and provide complementary data outputs Q and Qb. In the example of FIG. 4, a NOR gate 432 may receive a reset input R while a NOR gate 434 can receive a set input S. An output of NOR gate 432 can provide an output Q and an output of NOR gate 434 may provide a complementary output Qb.

The various signals (RCL, STO, CG, PW and RD) can have values as shown in FIG. 2. In addition, particular signals may be combined to reduce line pitch requirements as also described.

Further, in a recall preset, set/reset signals S and R can have particular values to place data nodes 414 and 416 into predetermined logic states. More particularly, for the NOR-based SR-FF, a reset signal R can be high, while a set signal S can be low. Then, in a static or dynamic recall both a reset and set signal (R and S) can be low. Such an arrangement may allow a data node 414 to be discharged or remain charged according to the state of a nonvolatile device 418.

As shown in FIG. 4, a control device 422 can be connected between a power supply Vcc and the positive supply to a NOR gate 434. If a NOR gate 434 is a CMOS type NOR gate, a control device may be situated in series with two series-connected p-channel transistors of NOR gate 434.

Of course, a volatile circuit portion 402 can be subject to many variations. As but one of the many possible examples, a volatile portion 402 may include a NAND-based SR FF. As is well understood in the art, a NAND-based SR FF may receive an active low set signal Sb and active low reset signal Rb. To place data nodes into a desired complementary configuration in a recall preset, a set signal Sb can be high while a reset signal Rb can be low. Further, if such NAND gates are CMOS NAND gates, a control transistor 422 may be in series with a p-channel transistor that draws current when data node 414 can be discharged in a recall mode due to an erased nonvolatile device 418, namely in series with the p-channel transistor that is in the feedback path controlled by NAND gate 432.

Figure 5:
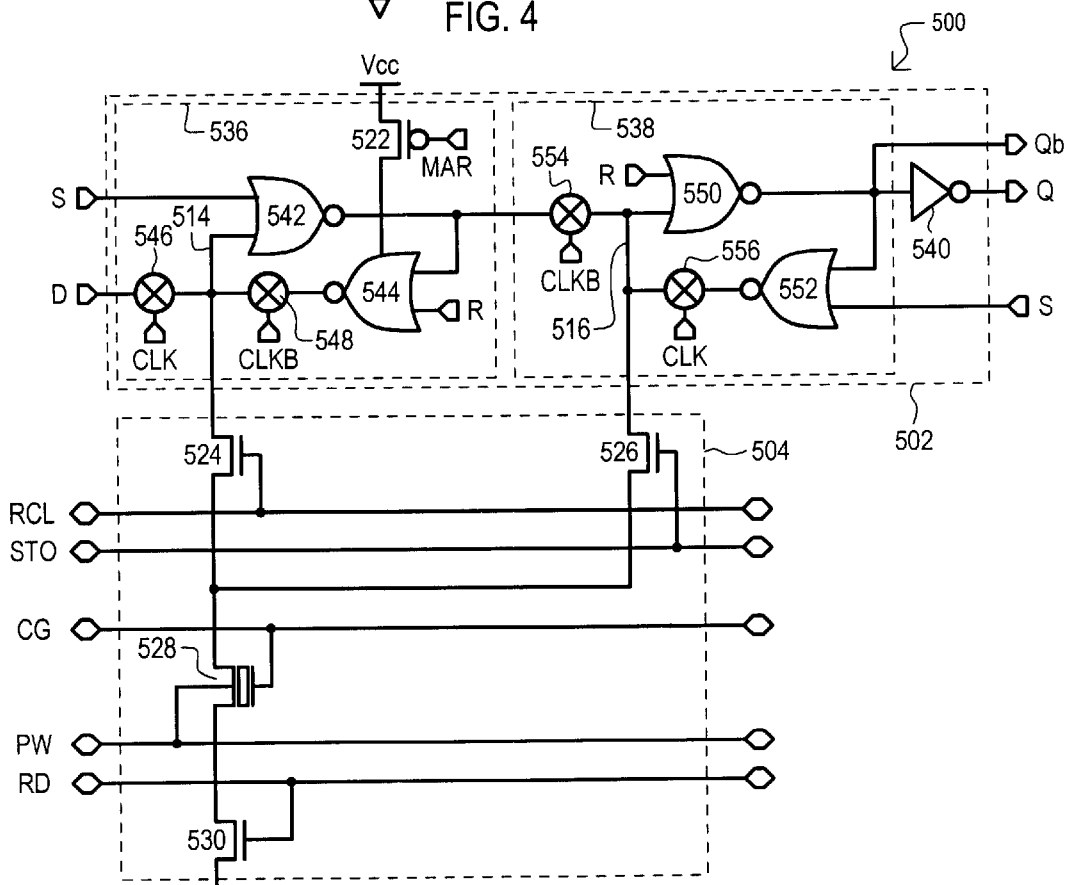
FIG. 5 is a schematic diagram of a fifth embodiment.

Referring now to FIG. 5, a fifth embodiment is designated by the general reference character 500 and may include a volatile circuit portion 502 and a nonvolatile circuit portion 504. A fifth embodiment 500 may include some of the same general constituents as a first embodiment 100. To that extent, like circuit elements will be referred to the by same reference character to but with the first digit being a "5" instead of a "1".

As shown in FIG. 5, a volatile portion 502 may include a D-type set-reset flip-flop (D-type SR FF) circuit. The particular D-type SR FF shown may be a NOR gate based, and may include a first clocked stage 536, a second clocked stage 538, and an output inverter 540. A first clocked stage 536 may include cross-coupled NOR gates 542 and 544, input transfer gate 546, and latching transfer gate 548. In a similar fashion, a second clocked stage 538 may include cross-coupled NOR gates 550 and 552, input transfer gate 554, and latching transfer gate 556.

The various signals (RCL, STO, CG, PW and RD) can have values as shown in FIG. 2. In addition, particular signals may be combined to reduce line pitch requirements as also described. It is also noted that a store operation may take data from a slave flip-flop 538 and return it, after recall, to a master flip-flop 536.

In addition, in a recall preset, various signals may be applied that can force a data node 514 high and a data node 516 low. For example, set inputs S can be high, a clock signal CLK can be low (causing inverse clock signal CLKB to be high), and reset inputs R can be low. As another example, set and reset inputs (S and R) can both be low. Then, a high data value D can be clocked into the circuit.

In a static or dynamic recall, both a reset and set signal (R and S) can be low while a clock signal CLK is low (and inverse clock CLKB high). Such an arrangement may allow a data node 514 to be discharged or remain charged according to the state of a nonvolatile device 528.

Like the fourth embodiment 400, in a fifth embodiment 500, a control device 522 can be connected between a power supply Vcc and the positive supply to a NOR gate 544. If a NOR gate 544 is a CMOS type NOR gate, a control device 522 may be situated in series with two series-connected p-channel transistors.

In addition, a volatile circuit portion 502 can be subject to many variations in the same fashion as that of a fourth embodiment. As but one of the many possible examples, a volatile portion 502 may include a NAND-based D-type SR FF.

A NAND-based D-type SR FF can receive active low set and reset signals (Sb and Rb). To place data nodes into a desired complementary configuration in a recall preset, a set signal Sb can be high, a reset signal Rb can be low, and a clock signal CLK can be low. Further, if such NAND gates are CMOS NAND gates, a control transistor 522 may be in series with a p-channel transistor within NOR gate 544 that draws current when data node 514 can be discharged in a recall mode due to an erased nonvolatile device 528, namely in series with the p-channel transistor that is in the feedback path controlled by NAND gate 542.

Various circuits having nonvolatile functions have been described. Such circuits can allow a circuit to be recalled into a predetermined state according to the state of a nonvolatile device. The various embodiments may include a single nonvolatile device, which can allow for a compact circuit design. Still further, the various embodiments may include separate store and recall paths to a nonvolatile device, which can allow for back to back store/recall operation that does not invert data values in a circuit. However, such embodiments represent but particular examples of the invention, and should not be construed as limiting the invention to particular circuits.

In addition, it is understood that while a preferred embodiment can include SONOS transistors, the present invention is not necessarily limited to such an arrangement. As just one example, alternate embodiments can include other nonvolatile devices capable of providing at least two different states.

Thus, it is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A nonvolatile circuit, comprising:
a volatile circuit portion having a first data node that may store a value complementary to a second data node; and
a nonvolatile circuit portion having a nonvolatile device coupled to the first data node by a recall path and to the second data node by a store path.

2. The nonvolatile circuit of claim 1, wherein:
the nonvolatile device includes a field effect transistor with a charge-storing layer between a substrate and a gate.

3. The nonvolatile circuit of claim 2, wherein:
the field effect transistor includes a silicon-oxide-nitride-oxide-silicon (SONOS) type transistor.

4. The nonvolatile circuit of claim 1, wherein:
the volatile circuit portion includes a static random access memory cell.

5. The nonvolatile circuit of claim 1, wherein:
the volatile circuit portion includes a set-reset flip-flop circuit.

6. The nonvolatile circuit of claim 1, wherein:
the volatile circuit portion includes a control device having a controllable current path between the first data node and a first power supply; and
the nonvolatile device is between the first data node and a second power supply.

7. The nonvolatile circuit of claim 1, wherein:
the nonvolatile device includes an n-channel nonvolatile field effect transistor.

8. A circuit, comprising:
a volatile circuit having a first data node that may be recalled to a predetermined state, the first data node being arranged in series with a nonvolatile device current path that varies according to a programmed state and a control device current path that varies according to a margin signal.

9. The circuit of claim 8, wherein:
the nonvolatile device current path includes a source-drain path of a nonvolatile field effect transistor that may have a high threshold voltage state and a low threshold voltage state.

10. The circuit of claim 8, wherein:
the control device current path includes a source-drain path of a control field effect transistor having a gate that receives the margin signal.

11. The circuit of claim 8, further including:
the volatile circuit includes a second node that may have a value complementary to a value at the first node.

12. The circuit of claim 11, wherein:
the volatile circuit includes a static random access memory cell circuit having a first driver transistor with a source-drain path in series with the first data node, the control device current path, and the nonvolatile device current path, and a second driver transistor with a source-drain path in series with the second data node.

13. The circuit of claim 8, further including:
a program device current path in series with the nonvolatile device current path and in parallel with the control device current path.

14. The circuit of claim 8, wherein:

the volatile circuit includes a flip-flop circuit having a flip-flop device that is activated when the first node is recalled to the predetermined state and the control device is arranged in series with the flip-flop device.

15. The circuit of claim 8, wherein:

the volatile circuit includes a set-reset D-type flip-flop circuit.

16. A nonvolatile circuit, comprising:

a recall current path that couples a first node to a nonvolatile device and that can set the first node to one of at least two voltages according to a state of the nonvolatile device in a recall operation; and a store current path that can set the state of the nonvolatile device according to a voltage at a second node in a store operation.

17. The nonvolatile circuit of claim 16, wherein:

the nonvolatile device includes a nonvolatile field effect transistor that can have an erased state and can be set to a program state by a program gate voltage and the voltage of the second node in the store operation.

18. The nonvolatile circuit of claim 16, wherein:

the nonvolatile device may be set to a first state or a second state; and the first node can be preset to a first voltage and in a recall operation, recalled to a second voltage if the nonvolatile device is in the first state or recalled to the first voltage if the nonvolatile device is in the second state.

19. The nonvolatile circuit of claim 16, further including:

an isolation device between the nonvolatile device and first supply voltage and a control device that can limit current supplied to the first node, the isolation device and control device being controlled by the same signal.

20. The nonvolatile circuit of claim 16, wherein:

the store current path includes a store field effect transistor having a gate that receives a control gate signal and the nonvolatile device includes a nonvolatile field effect transistor having a gate that receives the control gate signal.

21. The nonvolatile circuit of claim 16, wherein:

the recall current path and store current path include n-channel field effect transistors and the nonvolatile device includes an n-channel nonvolatile field effect transistor.

\* \* \* \* \*